(12) United States Patent
Kim et al.

(10) Patent No.: US 8,842,438 B2
(45) Date of Patent: Sep. 23, 2014

(54) 3D POWER MODULE PACKAGE

(75) Inventors: Tae Hoon Kim, Gyunggi-do (KR); Jae Cheon Doh, Chungcheongnam-do (KR); Seog Moon Choi, Seoul (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 406 days.

(21) Appl. No.: 13/177,270

(22) Filed: Jul. 6, 2011

(65) Prior Publication Data

US 2012/0162931 A1    Jun. 28, 2012

(30) Foreign Application Priority Data

Dec. 24, 2010    (KR) .................. 10-2010-0134862

(51) Int. Cl.
| | | |
|---|---|---|
| H05K 7/00 | (2006.01) | |
| H01L 23/34 | (2006.01) | |
| H01L 23/31 | (2006.01) | |
| H01L 23/495 | (2006.01) | |
| H01L 23/433 | (2006.01) | |
| H01L 25/16 | (2006.01) | |

(52) U.S. Cl.
CPC ..... *H01L 23/3121* (2013.01); *H01L 2924/0002* (2013.01); *H01L 23/49575* (2013.01); *H01L 23/4334* (2013.01); *H01L 23/49531* (2013.01); *H01L 25/16* (2013.01)
USPC ............ 361/728; 361/729; 257/678; 257/712

(58) Field of Classification Search
CPC ............ H01L 23/4334; H01L 23/3672; H01L 2023/405; H01L 2023/4062; H01L 23/36
USPC ......... 361/729, 728, 715, 704, 813, 783, 709; 257/675, 706, 678, 712, 666; 438/123
See application file for complete search history.

(56) References Cited

U.S. PATENT DOCUMENTS

| | | | | |
|---|---|---|---|---|
| 5,444,297 | A | * | 8/1995 | Oshima et al. ............... 257/691 |
| 5,942,797 | A | * | 8/1999 | Terasawa ...................... 257/723 |
| 6,144,571 | A | * | 11/2000 | Sasaki et al. .................. 363/144 |

(Continued)

FOREIGN PATENT DOCUMENTS

| | | |
|---|---|---|
| JP | 2000-228492 | 8/2000 |
| JP | 2006-121861 | 5/2006 |

(Continued)

OTHER PUBLICATIONS

Applicant-provided Office Action issued for related Korean Patent Application No. 10-2010-0134862, dated Feb. 26, 2013, and its English summary, also provided by the Applicant.
Office Action for related Japanese patent application No. 2011-125964 dated Oct. 16, 2012 and its English summary.

*Primary Examiner* — Angel R Estrada
*Assistant Examiner* — Dimary Lopez Cruz
(74) *Attorney, Agent, or Firm* — Ladas & Parry, LLP

(57) ABSTRACT

Disclosed herein is a 3D power module package, including: a power converting unit packaged to include a heat radiating substrate, a power device connected to the heat radiating substrate, and a lead frame; a controlling unit packaged to include a controlling unit substrate and IC and controlling devices mounted on an upper portion of the controlling unit substrate; and an electrical connecting unit electrically connecting the packaged power converting unit and the packaged controlling unit.

4 Claims, 6 Drawing Sheets

(56) References Cited

U.S. PATENT DOCUMENTS

| | | | |
|---|---|---|---|
| 6,421,244 B1* | 7/2002 | Shinohara et al. | 361/736 |
| 6,522,239 B1* | 2/2003 | Peschl | 338/59 |
| 6,958,535 B2* | 10/2005 | Hirano et al. | 257/707 |
| 7,208,833 B2* | 4/2007 | Nobori et al. | 257/704 |
| 7,501,585 B2* | 3/2009 | Killer et al. | 174/260 |
| 7,663,886 B2* | 2/2010 | Aoki et al. | 361/715 |
| 8,198,139 B2* | 6/2012 | Yang | 438/123 |
| 2003/0015778 A1* | 1/2003 | Soyano et al. | 257/678 |

FOREIGN PATENT DOCUMENTS

| | | |
|---|---|---|
| KR | 10-2001-0073784 | 8/2001 |
| KR | 10-2009-0093163 | 9/2009 |
| KR | 10-2010-0126909 | 12/2010 |

\* cited by examiner

3D POWER MODULE PACKAGE

CROSS REFERENCE TO RELATED APPLICATION

This application claims the benefit of Korean Patent Application No. 10-2010-0134862, filed on Dec. 24, 2010, entitled "3D Power Module Package", which is hereby incorporated by reference in its entirety into this application.

BACKGROUND OF THE INVENTION

1. Technical Field

The present invention relates to a 3D power module package.

2. Description of the Related Art

A power module, which is implemented through main techniques such as modulization and integration design technique, manufacturing process technique, characteristic test, reliability evaluation technique, etc. of a power semiconductor device and a package material, serves as DC rectifying and AC converting (DC switching) functions in an inverter end of a computer uninterruptible power supply system (USP) and a motor variable speed driver in home appliances, industrial facilities such as a welding machine, an industrial motor, a robot apparatus, etc. applications such as a transportation machinery field such as an HEV, an EV, an airplane, an automobile, a rail vehicle, etc.

The power module is a very important key component because it consumes about 50 or 60% of the material cost in a power converting apparatus (an inverter, a converter) field of an electrical driving system. Accordingly, the development for the power module having high density/high efficiency/light weight has been continuously conducted.

Particularly, there was a need for the power module to have a compact size/light weight in terms of a component mounted in a limited space. As the power module has progressed to a multi-functional module by integrating a component having various functions, it has been operated in a poor environment such as high temperature, vibration, etc. Therefore, it is very important for the power module to have high reliability.

According to the prior art, a package has been generally manufactured by mounting a power semiconductor device, a passive device, a drive (IC), and the like, on an upper surface of a lead frame using solder, a conductive epoxy resin, or the like, connecting wirings thereto through wire bonding, and then, manufacturing a shape of a device through EMC molding.

In some package structures, a power semiconductor device unit generating much heat and a controlling unit controlling the power semiconductor device unit have been separately mounted and have been implemented within a single package, thereby attempting thermal and functional separation. In addition, a heat sink has been mounted on an upper portion of a module in order to effectively control heat generated from the power semiconductor device unit. However, this structure has caused problems such as inter-pin insulating problem due to increase in the number of pins required during compactness, lightness, multi-function integration of the package structure, increase in a size due to an increase in a controlling unit area, and the like.

SUMMARY OF THE INVENTION

The invention has been made in an effort to provide a 3D power module package capable of reducing performance deterioration due to temperature and improving lifespan and reliability of a module.

According to a first preferred embodiment of the present invention, there is provided a 3D power module package, including: a power converting unit packaged to include a heat radiating substrate, a power device connected to the heat radiating substrate, and a lead frame; a controlling unit packaged to include a controlling unit substrate and IC and controlling devices mounted on an upper portion of the controlling unit substrate; and an electrical connecting unit electrically connecting the packaged power converting unit and the packaged controlling unit.

The heat radiating substrate may be an anodized aluminum substrate.

The electrical connecting unit may be formed of a solder ball or a conductive connector.

The 3D power module package may further include a damper provided between the power converting unit and the controlling unit.

The heat radiating substrate may have higher thermal conductivity than that of the controlling unit substrate.

According to a second preferred embodiment of the present invention, there is provided a 3D power module package, including: a power converting unit packaged to include a heat radiating substrate, a power device connected to the heat radiating substrate, and a lead frame; a controlling unit packaged to include a controlling unit substrate and IC and controlling devices mounted on an upper portion of the controlling unit substrate; and a connecting pin provided in the packaged power converting unit and a connecting socket provided in the controlling unit, wherein the connecting pin and the connecting socket are assembled to be electrically connected to each other.

The heat radiating substrate may be an anodized aluminum substrate.

The connecting pin and the connecting socket may be made of copper.

The 3D power module package may further include a damper provided between the power converting unit and the controlling unit.

The heat radiating substrate may have higher thermal conductivity than that of the controlling unit substrate.

DESCRIPTION OF THE PREFERRED EMBODIMENTS

Figure 1:
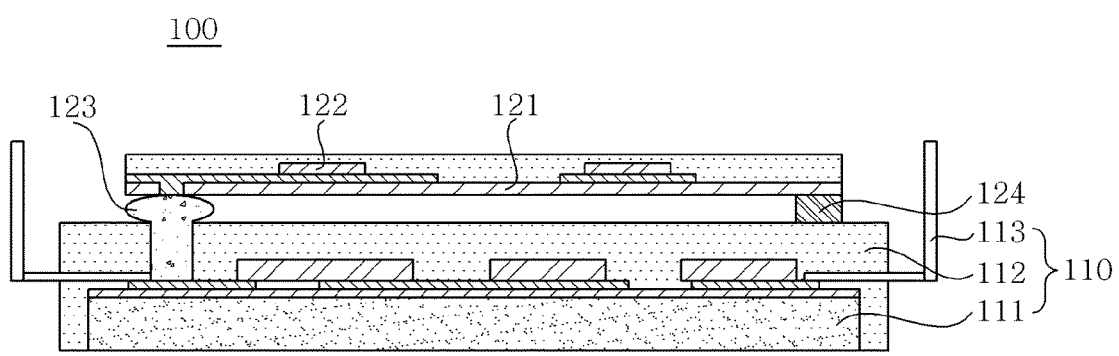
FIG. 1 is a view showing a 3D power module package according to a first preferred embodiment of the present invention.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, a detailed description thereof will be omitted.

Hereinafter, preferred embodiments of the present invention will be described in detail with reference to the accompanying drawings.

Figure 2:
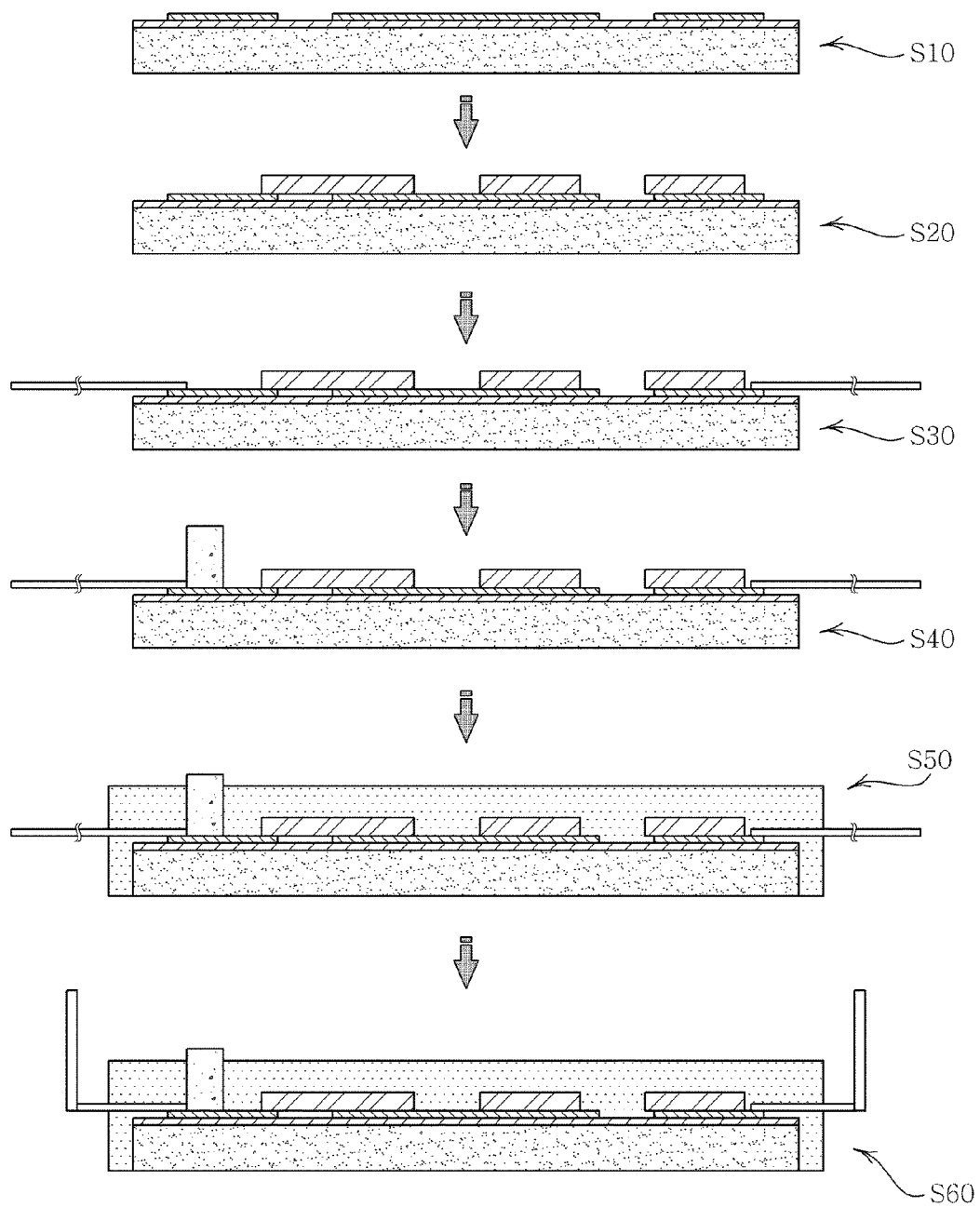
FIG. 2 is a flowchart showing a manufacturing process of a 3D power module package according to a first preferred embodiment of the present invention, particularly, a manufacturing process of a power converting unit.
Figure 3:
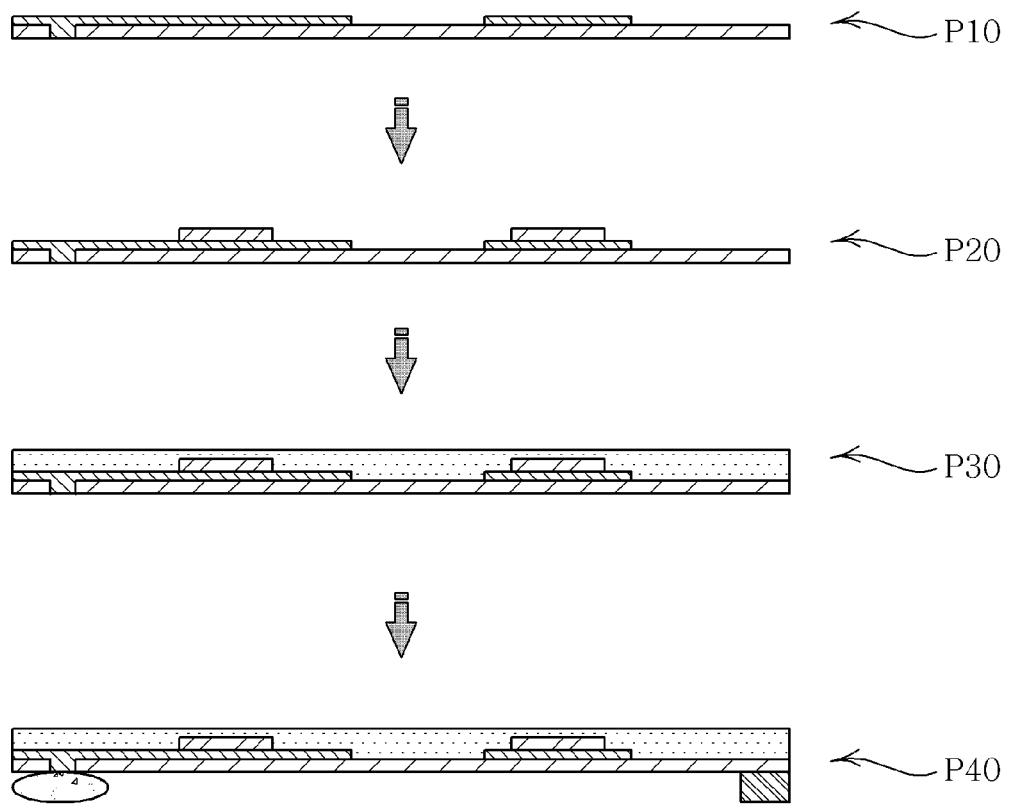
FIG. 3 is a flowchart showing a manufacturing process of a 3D power module package according to a first preferred embodiment of the present invention, particularly, a manufacturing process of a controlling unit.
Figure 4:
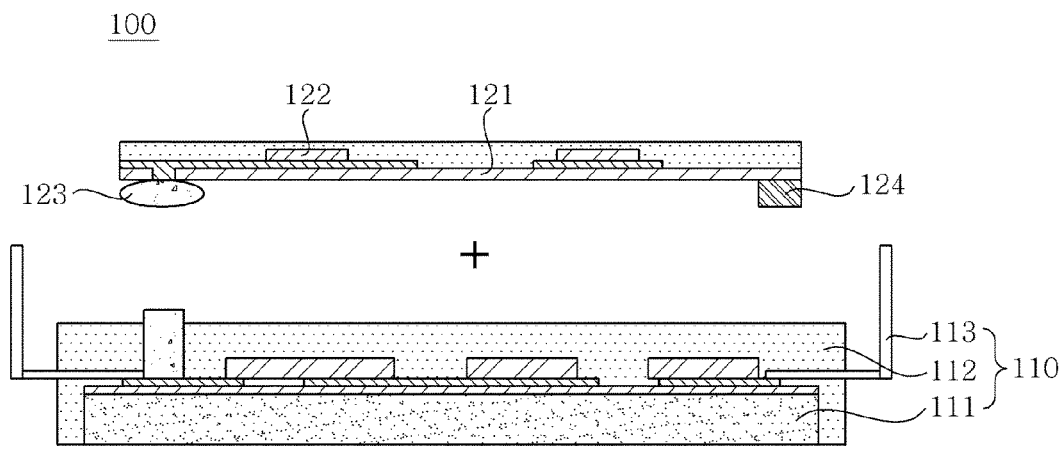
FIG. 4 is an assembling view of a power converting unit and a controlling unit according to a first preferred embodiment of the present invention.

FIG. 1 is a view showing a 3D power module package according to a first preferred embodiment of the present invention. FIG. 2 is a flowchart showing a manufacturing process of a 3D power module package according to a first preferred embodiment of the present invention, particularly, a manufacturing process of a power converting unit. FIG. 3 is a flowchart showing a manufacturing process of a 3D power module package according to a first preferred embodiment of the present invention, particularly, a manufacturing process of a controlling unit. FIG. 4 is an assembling view of a power converting unit and a controlling unit according to a first preferred embodiment of the present invention.

Figure 5:
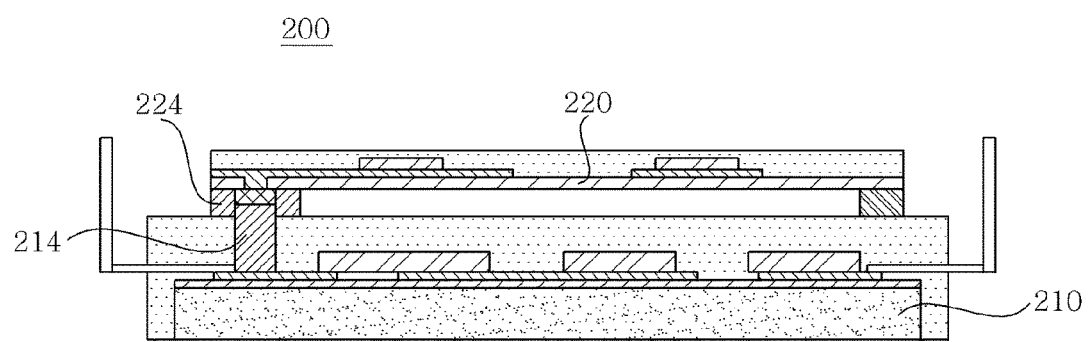
FIG. 5 is a view showing a 3D power module package according to a second preferred embodiment of the present invention.
Figure 6:
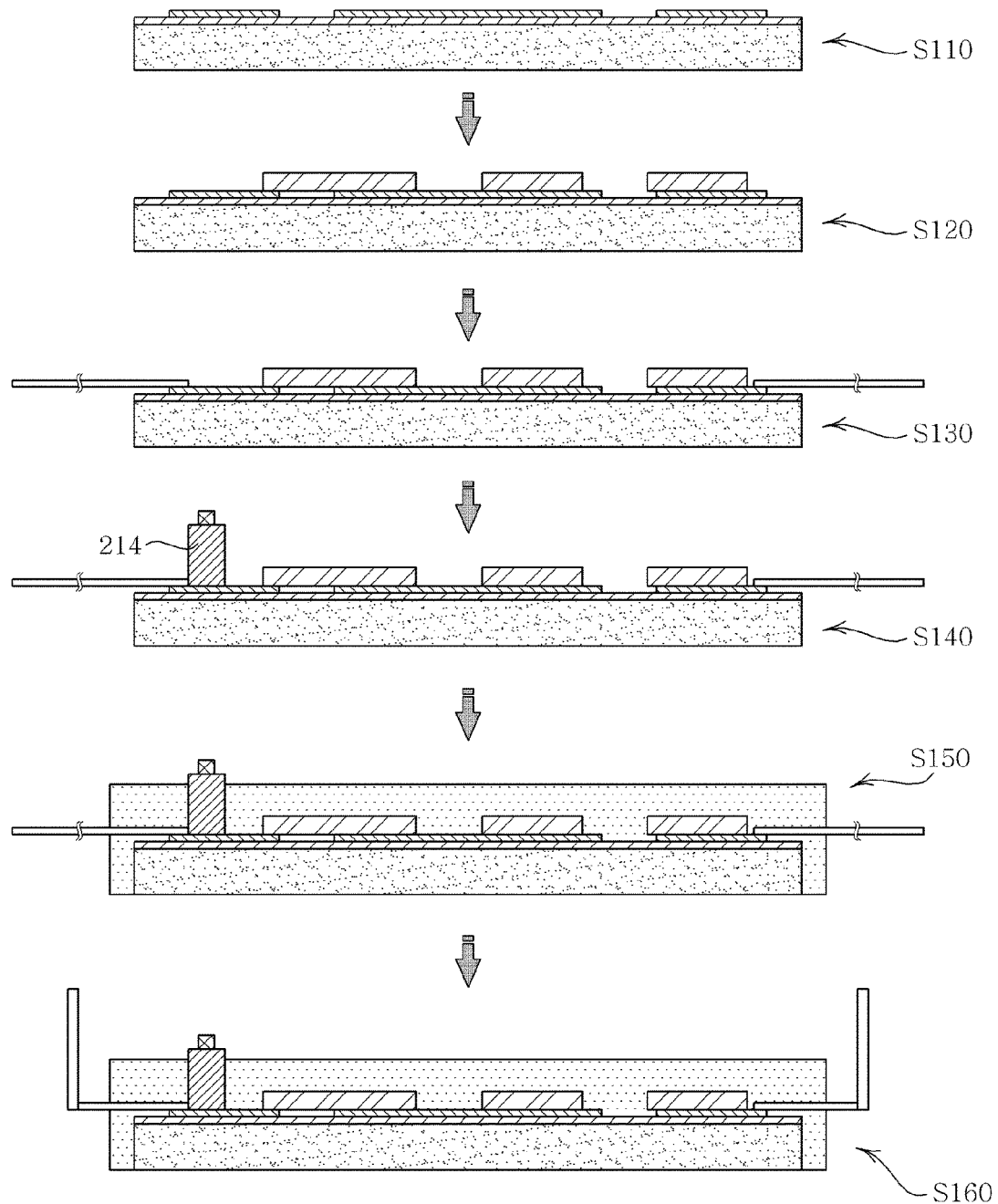
FIG. 6 is a flowchart showing a manufacturing process of a 3D power module package according to a second preferred embodiment of the present invention, particularly, a manufacturing process of a power converting unit.
Figure 7:
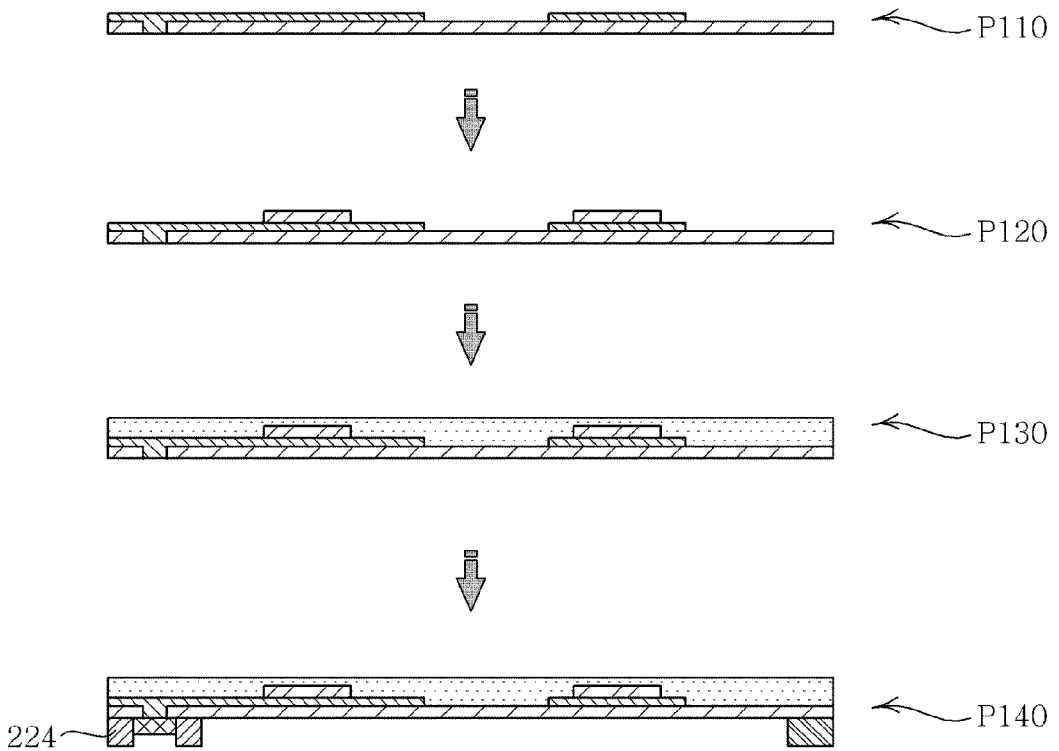
FIG. 7 is a flowchart showing a manufacturing process of a 3D power module package according to a second preferred embodiment of the present invention, particularly, a manufacturing process of a controlling unit.
Figure 8:
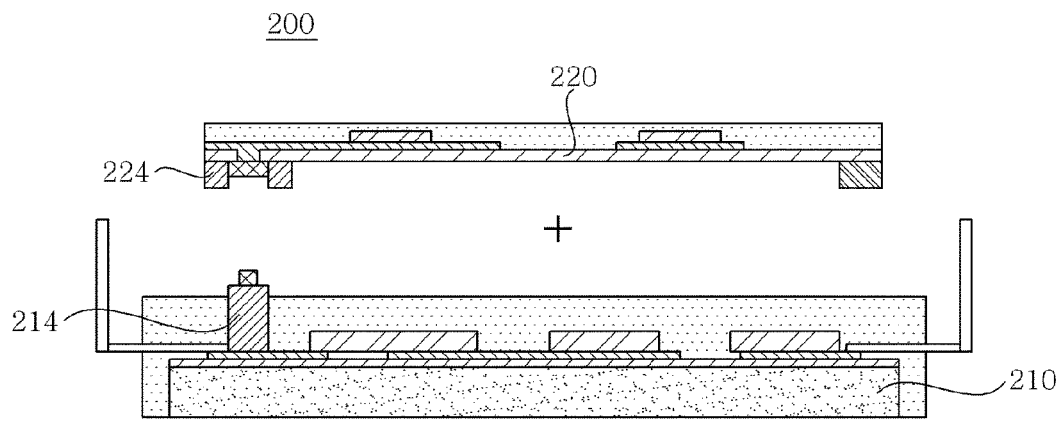
FIG. 8 is an assembling view of a power converting unit and a controlling unit according to a second preferred embodiment of the present invention.

FIG. 5 is a view showing a 3D power module package according to a second preferred embodiment of the present invention. FIG. 6 is a flowchart showing a manufacturing process of a 3D power module package according to a second preferred embodiment of the present invention, particularly, a manufacturing process of a power converting unit. FIG. 7 is a flowchart showing a manufacturing process of a 3D power module package according to a second preferred embodiment of the present invention, particularly, a manufacturing process of a controlling unit. FIG. 8 is an assembling view of a power converting unit and a controlling unit according to a second preferred embodiment of the present invention.

As shown in FIG. 1, a 3D power module package 100 according to a first preferred embodiment of the present invention is configured to include a power converting unit 110 configured of a heat radiating substrate 111, a power device 112, and a lead frame 113, and a controlling unit 120 configured of a controlling unit substrate 121, integrated circuit (IC) and controlling devices 122, an electrical connecting unit 123, and a damper 124.

As the heat radiating substrate 111, an anodized aluminum substrate may be preferably used, instead of a lead frame or a ceramic substrate used according to the prior art.

In addition, a power converting unit package for a power semiconductor device is manufactured to include the radiating substrate 111 made of a metal material having high thermal conductivity, thereby improving heat radiating characteristics in a power device product.

The power device 112, which is connected to the heat radiating substrate 111 to transmit and receive an electrical signal and perform electrical connection, includes an IC device, various electrical device, and the like.

The lead frame 113, which is connected to the power device 112, serves to apply the electrical signal applied from the power device 112 to other (external) components.

A package of a device for a control circuit is manufactured to include the controlling unit substrate 121 having low thermal conductivity, thereby improving a limitation of a 2D package structure, simultaneously with improving deterioration characteristics of peripheral devices due to temperature of a heat generating device and improving the lifespan and reliability of the module.

The IC and controlling devices 122, which are mounted on an upper portion of the controlling unit substrate 121, transmit and receive electrical signals.

The electrical connecting unit 123, which is provided between the power converting unit 110 and the controlling unit 120, electrically connects the controlling unit 120 having the controlling unit substrate 121 and the IC and controlling devices 122 packaged therein to an upper portion of the power converting unit 110 having the heat radiating substrate 111 and the power device 112 packaged therein. At this time, the electrical connecting unit 123 is provided as a solder ball or an electrical connector, wherein as the solder ball, a BGA solder ball or a general solder ball for a connector is used.

The heat radiating substrate 111 has higher thermal conductivity than that of the controlling unit substrate 121.

The damper 124, which is mounted between the power converting unit 110 and the controlling unit 120, absorbs impact during assembly of the power converting unit 110 and the controlling unit 120. The damper 124 is made of a rubber material or a buffering material. In addition, the damper increases a structural stability of a 3D module formed by assembling two modules, and implements a structure having high reliability.

FIG. 2 is a flowchart showing a manufacturing process of a 3D power module package according to a first preferred embodiment of the present invention, particularly, a manufacturing process of a power converting unit.

A manufacturing process of the power converting unit 110 includes preparing the heat radiating substrate of the power converting unit 110 (S10), attaching the power device onto the upper surface of the heat radiating substrate (S20), connecting the lead frame to a lower surface and a side portion of the power device (S30), forming a metal wiring for receiving the electrical signal on upper portions of the heat radiating substrate and the lead frame (S40), packaging the power converting unit 110 (S50), and trimming the lead frame to form the entire structure (S60).

FIG. 3 is a flowchart showing a manufacturing process of a 3D power module package 100 according to a first preferred embodiment of the present invention, particularly, a manufacturing process of a controlling unit.

A manufacturing process of the controlling unit 120 includes preparing the controlling unit substrate (P10), attaching the IC and controlling devices onto the upper portion of the controlling unit substrate (P20), packaging the controlling unit 120 (P30), and forming the solder ball and the damper on a lower portion of the controlling unit 120 (P40).

FIG. 4 is an assembling view of a power converting unit 110 and a controlling unit 120 of a 3D power module package 100 according to a first preferred embodiment of the present invention.

FIG. 5 is a view showing a 3D power module package 200 according to a second preferred embodiment of the present invention. Components and characteristics of the 3D power module package 200 according to a second preferred embodiment of the present invention are the same as those of the 3D power module package according to the first preferred embodiment of the present invention including the heat radiating substrate 111, the power device 112, the lead frame 113, the controlling unit substrate 121, the IC and controlling devices 122, and the damper 124. Therefore, a detailed description thereof will be omitted.

As shown in FIG. 5, in the 3D power module package 200 according to a second preferred embodiment of the present invention, a connecting pin 214 for connecting an electrical signal is provided to a power converting unit 210, a connecting socket 224 is provided to a controlling unit 220, and the connecting pin 214 and the connecting socket 224 are assembled to be electrically connected to each other.

At this time, the connecting pin 214 and the connecting socket 224 are made of a metal such as copper, which is capable of transmitting and receiving the electrical signal.

FIG. 6 is a flowchart showing a manufacturing process of a 3D power module package according to a second preferred embodiment of the present invention, particularly, a manufacturing process of a power converting unit 210.

A manufacturing process of the power converting unit 210 includes preparing the heat radiating substrate of the power converting unit 210 (S110), attaching the power device onto the heat radiating substrate (S120), connecting the lead frame to the power device (S130), forming the connecting pin 214 for receiving the electrical signal on upper portions of the heat radiating substrate and the lead frame (S140), entirely packaging the power converting unit 110 (S150), and trimming the lead frame to form the entire structure (S160).

FIG. 7 is a flowchart showing a manufacturing process of a 3D power module package 200 according to a second preferred embodiment of the present invention, particularly, a manufacturing process of a controlling unit 220.

A manufacturing process of the controlling unit 220 includes preparing the controlling unit substrate (P110), attaching the IC and controlling devices onto the upper portion of the controlling unit substrate (P120), packaging the controlling unit 220 (P130), and forming the connecting socket 224 for electrical connection and the damper on a lower portion of the controlling unit 220 (P140).

FIG. 8 is an assembling view of the power converting unit 210 and the controlling unit 220 of the 3D power module package 200 according to a second preferred embodiment of the present invention.

In the 3D power module packages 100 and 200 according to the preferred embodiments of the present invention having the above-mentioned structure, the power converting unit module having the power elements mounted therein to generate much heat and the controlling unit controlling the power converting unit module and vulnerable to the heat are separately assembled in a three dimensional scheme and are integrated in a single module, thereby making it possible to achieve an integrated structure having high reliability.

Accordingly, the size of the module may be reduced to increase the mounting density of the substrate, and a limitation factor of the control pin may be removed and the controlling unit may be freely implemented, through 3D high integration modulization. In addition, the lifespan and the function of the IC, etc. vulnerable to the heat may be protected, power rating of module temperature may be increased and the cost may be reduced through independent structures of the heat radiating unit and the controlling unit.

Although the preferred embodiments of the present invention have been disclosed for illustrative purposes, they are for specifically explaining the present invention and thus a 3D power module package according to the present invention is not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A 3D power module package, comprising:
   a power converting unit packaged to include a heat radiating substrate, a power device connected to the heat radiating substrate, and a lead frame;
   a controlling unit packaged to include a controlling unit substrate and IC and controlling devices mounted on an upper portion of the controlling unit substrate;
   a damper provided between the power converting unit and the controlling unit; and
   an electrical connecting unit provided between the power converting unit and the controlling unit, the electrical connecting unit electrically connecting the power converting unit and the controlling unit,
   wherein the lead frame serves to apply an electrical signal applied from the power device to one or more external components,
   wherein the electrical connecting unit is formed of a solder ball, and
   wherein the heat radiating substrate has higher thermal conductivity than that of the controlling unit substrate.

2. The 3D power module package as set forth in claim 1, wherein the heat radiating substrate is an anodized aluminum substrate.

3. A 3D power module package, comprising:
   a power converting unit packaged to include a heat radiating substrate, a power device connected to the heat radiating substrate, and a lead frame;
   a controlling unit packaged to include a controlling unit substrate and IC and controlling devices mounted on an upper portion of the controlling unit substrate;
   a damper provided between the power converting unit and the controlling unit; and
   a connecting pin provided in the power converting unit and a connecting socket provided in the controlling unit,
   wherein the connecting pin and the connecting socket are assembled to be electrically connected to each other,
   wherein the lead frame serves to apply an electrical signal applied from the power device to one or more external components,
   wherein the heat radiating substrate has higher thermal conductivity than that of the controlling unit substrate, and
   wherein the heat radiating substrate is an anodized aluminum substrate.

4. The 3D power module package as set forth in claim 3, wherein the connecting pin and the connecting socket are made of copper.

* * * * *